(12) United States Patent
Wagner et al.

(10) Patent No.: US 8,513,685 B2
(45) Date of Patent: Aug. 20, 2013

(54) ELECTRICALLY PIXELATED LUMINESCENT DEVICE INCORPORATING OPTICAL ELEMENTS

(75) Inventors: Nicole J. Wagner, Monrovia, CA (US); Craig R. Schardt, Woodbury, MN (US); Catherine A. Leatherdale, Woodbury, MN (US); Andrew J. Ouderkirk, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/128,344

(22) PCT Filed: Nov. 6, 2009

(86) PCT No.: PCT/US2009/063477
§ 371 (c)(1),
(2), (4) Date: Aug. 29, 2011

(87) PCT Pub. No.: WO2010/056596
PCT Pub. Date: May 20, 2010

(65) Prior Publication Data
US 2011/0303893 A1    Dec. 15, 2011

Related U.S. Application Data

(60) Provisional application No. 61/114,237, filed on Nov. 13, 2008.

(51) Int. Cl.
| H01L 29/22 | (2006.01) |
| H01L 33/00 | (2010.01) |
| H01L 27/15 | (2006.01) |
| H01L 29/26 | (2006.01) |
| H01L 31/12 | (2006.01) |
| H01L 29/06 | (2006.01) |
| H01L 31/0328 | (2006.01) |
| H01L 31/0336 | (2006.01) |
| H01L 31/072 | (2012.01) |
| H01L 31/109 | (2006.01) |

(52) U.S. Cl.
USPC ................ 257/95; 257/13; 257/79; 257/94; 257/98; 257/E33.001; 257/E33.074

(58) Field of Classification Search
USPC .......... 257/13, 79, 94, 95, E33.001, E33.074, 257/98
See application file for complete search history.

(56) References Cited

U.S. PATENT DOCUMENTS 5,162,878 A * 11/1992 Sasagawa et al. ............... 257/88
5,952,680 A    9/1999 Strite
(Continued)

FOREIGN PATENT DOCUMENTS

JP    09-153644    6/1997
JP    10173284 A *  6/1998
(Continued)

OTHER PUBLICATIONS

Chakraborty et al., Interdigitated Multipixel Arrays for the Fabrication of High-Power Light-Emitting Diodes With Very Low Series Resistances, Appl. Phys. Lett., vol. 88, pp. 181120-1-181120-3, (2006).

(Continued)

*Primary Examiner* — Ida M Soward
(74) *Attorney, Agent, or Firm* — Kristofor L. Storvick

(57) ABSTRACT

Electrically pixelated luminescent devices incorporating optical elements, methods for forming electrically pixelated luminescent devices incorporating optical elements, and systems including electrically pixelated luminescent devices incorporating optical elements are described.

15 Claims, 9 Drawing Sheets

(56) References Cited

U.S. PATENT DOCUMENTS

| | | | |
|---|---|---|---|
| 6,410,940 B1 | 6/2002 | Jiang | |
| 6,563,138 B2 | 5/2003 | Ogihara | |
| 6,600,175 B1 | 7/2003 | Baretz | |
| 6,784,462 B2 | 8/2004 | Schubert | |
| 6,897,855 B1 | 5/2005 | Matthies | |
| 6,900,473 B2* | 5/2005 | Yoshitake et al. | 257/95 |
| 6,987,613 B2* | 1/2006 | Pocius et al. | 359/565 |
| 7,060,542 B2 | 6/2006 | Nakajima | |
| 7,068,418 B2 | 6/2006 | Kawase | |
| 7,129,528 B2 | 10/2006 | Bader | |
| 7,244,957 B2 | 7/2007 | Nakajo | |
| 7,250,320 B2 | 7/2007 | Okyuama et al. | |
| 7,317,212 B2* | 1/2008 | Shin | 257/98 |
| 7,462,869 B2* | 12/2008 | Ohashi et al. | 257/79 |
| 7,541,206 B2* | 6/2009 | Yoon et al. | 438/29 |
| 7,642,562 B2* | 1/2010 | Kovsh et al. | 257/98 |
| 7,732,802 B2* | 6/2010 | Cho et al. | 257/13 |
| 7,893,448 B2* | 2/2011 | Kim | 257/95 |
| 7,968,305 B2* | 6/2011 | Wang et al. | 435/7.2 |
| 7,989,830 B2* | 8/2011 | Streubel et al. | 257/98 |
| 8,097,887 B2* | 1/2012 | Yamanaka et al. | 257/98 |
| 8,124,991 B2* | 2/2012 | Iso et al. | 257/79 |
| 8,174,037 B2* | 5/2012 | Edmond et al. | 257/98 |
| 8,198,645 B2* | 6/2012 | Sakai | 257/98 |
| 8,274,092 B2* | 9/2012 | Yao et al. | 257/98 |
| 2003/0063645 A1* | 4/2003 | Yoshida et al. | 372/49 |
| 2004/0113166 A1* | 6/2004 | Tadatomo et al. | 257/98 |
| 2006/0091786 A1 | 5/2006 | Chakraborty | |
| 2006/0138434 A1 | 6/2006 | Summers | |
| 2006/0208273 A1 | 9/2006 | Kang | |
| 2006/0284190 A1 | 12/2006 | Zimmerman | |
| 2006/0284195 A1 | 12/2006 | Nagai | |
| 2007/0018184 A1 | 1/2007 | Beeson | |
| 2007/0059852 A1 | 3/2007 | Miyachi | |
| 2007/0091443 A1 | 4/2007 | Lim | |
| 2007/0166851 A1 | 7/2007 | Tran | |
| 2007/0278493 A1* | 12/2007 | Sato | 257/72 |
| 2008/0087906 A1 | 4/2008 | Murase | |
| 2008/0272712 A1 | 11/2008 | Jalink | |
| 2008/0283855 A1 | 11/2008 | Streubel | |
| 2011/0156616 A1* | 6/2011 | Anderson et al. | 315/312 |
| 2012/0018701 A1* | 1/2012 | Bergmann et al. | 257/13 |

FOREIGN PATENT DOCUMENTS

| | | |
|---|---|---|
| JP | 2008-047618 | 2/2008 |
| WO | 2010/028146 | 3/2010 |

OTHER PUBLICATIONS

Chichibu et al., Spontaneous Emission of Localized Excitons in InGaN Single and Multiquantum Well Structures, Appl. Phys. Lett., vol. 69, No. 27, pp. 4188-4190, (Dec. 30, 1996).

Choi et al., Efficient GaN-Based Micro-Led Arrays, Mat. Res. Soc. Symp. Proc., vol. 743, pp. L6.28.1-L6.28-6, (2003).

Choi et al., Fabrication and Performance of Parallel-Addressed InGaN Micro-Led Arrays, IEEE Photonics Technology Letters, vol. 15, No. 4, pp. 510-512, (2003).

Coquillat et al., Studies of the Photonic and Optical-Frequency Phonon Properties of Arrays of Selectively Grown GaN Micropyramids, J. of App. Phys., vol. 103, pp. 044910-1-044910-7 (2008).

Ee et al., Enhancement of Light Extraction Efficiency of InGaN Quantum Wells Light Emitting Diodes Using $SiO_2$/Polystyrene Microlens Arrays, Appl. Phys. Lett., vol. 91, pp. 221107-1-221107-3 (2007).

Gardner et al., Blue-Emitting InGaN-GaN Double-Heterostructure Light-Emitting Diodes Reaching Maximum Quantum Efficiency Above 200 A/$cm^2$, Appl. Phys. Lett., vol. 91, pp. 243506-1-243506-3, (2007).

Jin et al., Size Dependence of III-Nitride Microdisk Light-Emitting Diode Charatcteristics, Appl. Phys. Lett., vol. 78, No. 22, pp. 3532-3534, (May 28, 2001).

Kim et al., Effect of GaN Microlens Array on Efficiency of GaN-Based Blue-Light-Emitting-Diodes, Jpn. J. of App. Phys., vol. 44, No. 1, pp. L18-L20, (2005).

Kim et al., A Fabrication of GaN Micro-Lens, Digest of the IEEE/ Leos Summer Topical Meetings, Vertical-Cavity Lasers, pp. 54-55, (Aug. 11-13, 1997). (XP002293923).

Lee, Electrode Design for InGaN/Sapphire Led'S Based on Multiple Thin Ohmic Metal Patches, Proc. of SPIE, vol. 5530, pp. 338-346, (2004).

Miyake et al., Blue Emission From InGaN/GaN Hexagonal Pyramid Structures, Superlattices and Microstructures, vol. 41, pp. 341-346 (2007).

Nakamura et al., InGaN/AlGaN Blue-Light-Emitting Diodes, J. Vac. Sci. Technol., vol. A 13, No. 3, pp. 705-710, (May/Jun. 1995).

Nakamura et al., Superbright Green InGaN Single-Quantum-Well-Structure Light-Emitting Diodes, Jpn. J. Appl. Phys., vol. 34, Part 2, No. 10B, pp. L1332-L1335, (Oct. 15, 1995).

Oder et al., Nitride Microlens Arrays for Blue and Ultraviolet Wavelength Applications, Appl. Phys. Lett., vol. 82, No. 21, pp. 3692-3694 (May 26, 2003).

Schubert, Light Emitting Diodes, Cambridge University Press, Cambrige, United Kingdom, 2006.

Shen et al., Optical Cavity Effects in InGaN Quantum-Well-Heterostructure Flip-Chip Light-Emitting Diodes, App. Phys. Lett., vol. 82, No. 14, pp. 2221-2223, (Apr. 7, 2003).

Sze, Physics of Semiconductor Devices, John Wiley and Sons, 5 pages, (1981).

Tong, Q-Y and Gosele, U., "Surface Preparation and Room-Temperature Wafer Bonding" and "Bonding of Structured Wafers", Semiconductor Wafer Bonding, John Wiley & Sons, New York, Chapters 4 and 10, pp. 49-101 and pp. 223-232, (1999).

Search Report for International Application No. PCT/US2009/063477, Date of Mailing May 28, 2010, 3 pages.

Written Opinion for International Application No. PCT/US2009/063477, Date of Mailing May 28, 2010, 4 pages.

* cited by examiner

ELECTRICALLY PIXELATED LUMINESCENT DEVICE INCORPORATING OPTICAL ELEMENTS

CROSS REFERENCE TO RELATED APPLICATIONS

This application is a national stage filing under 35 U.S.C. 371 of PCT/US2009/063477, filed on Nov. 6, 2009, which claims priority to U.S. Provisional Application No. 61/114,237, filed on Nov. 13, 2008, the disclosure of which is incorporated by reference in its/their entirety herein.

FIELD OF INVENTION

The described invention relates to light emitting systems. In particular the invention relates to electrically pixelated luminescent devices.

SUMMARY

In one aspect, the present disclosure provides an electrically driven pixelated luminescent device (EPLD). The EPLD may include a p-layer having both a p-layer electrode surface and a p-layer interface surface. The EPLD may further include an n-layer having both an n-layer electrode surface and an n-layer interface surface. The device may include a continuous emitter region with at least one localized light emitting region disposed between the n-layer interface surface and the p-layer interface surface. The device may also include at least one p-layer electrode and one n-layer electrode where at least one of the p-layer electrode or n-layer electrode is made up of a plurality of individually addressable electrodes. Upon providing electrical potential between the p-layer electrode and the n-layer electrode, an emitting region may be produced within the continuous emitter region. Further, one or more optical elements may be positioned to receive light from one or more light emitting regions.

In another aspect the present description provides a method for creating an illumination device. The method involves depositing an undoped buffer layer on a substrate. An n-type layer is deposited on top of the buffer layer. Further, a multiple quantum well is deposited on top of the n-type layer. A p-type layer is deposited on top of the multiple quantum well. The method further includes removing the substrate and optionally removing the buffer layer. Further, at least one optical element is constructed in an outer surface of the buffer layer, n-type layer, or the p-type layer; and one or more electrodes are deposited on the p-type layer surface and the n-type layer surface.

In yet another aspect, the present disclosure provides an EPLD. The EPLD includes an outer semiconductor layer that has a light emission face which may include a common electrode. The device further includes an inner semiconductor layer that has a non-emission face which may comprise a plurality of individually addressable electrodes. A continuous emitter region may be disposed between the outer semiconductor layer and the inner semiconductor layer. The continuous emitter region includes a plurality of localized light emission regions. In addition, the EPLD may include at least one optical element formed into the light emission face of the outer semiconductor layer, where each optical element is positioned to receive light from a localized light emission region.

The present disclosure provides, in another aspect, a pixelated light emitting system. The system includes an outer semiconductor layer and an inner semiconductor layer. The outer semiconductor layer includes a light emission face comprising an electrode. The outer semiconductor layer may also be shaped into a plurality of optical elements. The inner semiconductor layer includes a non-emission face comprising a plurality of individually addressable electrodes. The system further may include a continuous emitter region comprising multiple localized light emission regions. The continuous emitter region may be disposed between the outer semiconductor layer and the inner semiconductor layer. The system also may include a switching circuit for supplying current to each of the individually addressable electrodes. The plurality of optical elements in the system receive light from localized light emission regions.

BRIEF DESCRIPTION OF THE DRAWINGS

The description may be more completely understood and appreciated in consideration of the following detailed description of various embodiments in connection with the accompanying drawings, in which.

DETAILED DESCRIPTION

Figure 1:
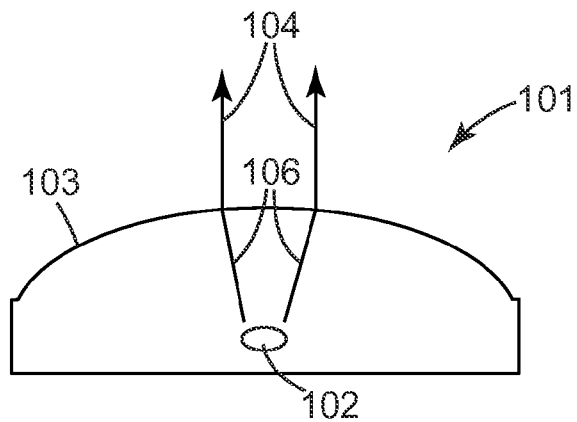
FIG. 1 is a simplified cross-sectional view of an EPLD with an optical element.

Pixelated luminescent devices (PLDs), in particular pixelated electroluminescent devices, may be useful in a number of applications, such as in displays, as a light source, for projector illumination, in sensors (e.g., biological sensors), and for digital signage. Display applications include, for instance, backlighting for a light valve imager (e.g., transmissive LCD imagers), as well as serving as an imager for direct projection (e.g., pico-projector, portable projectors, rear projection television, and icon/pointer projection). For projector illumination applications, pixelated luminescent devices such as those described herein may provide short mixing distances. Light source applications include, for instance, solid state lighting (e.g., architectural lighting).

In one aspect, the electrically pixelated luminescent devices (EPLDs) described herein differ from physically pixelated arrays of luminescent elements in that the light emitter region in the EPLDs described herein is continuous. That is, arrays of luminescent elements typically require physical discontinuity between elements, in particular physical discontinuity of the light emitter region. In contrast, the individually addressable electrodes, in combination with the continuous light emitter region in the EPLDs described herein, give rise to a luminescent device that is electrically, as compared to physically, pixelated.

The process for producing physically pixelated arrays (for instance by etching through light emitting diode materials such as GaN) may be expensive and tedious and requires substantial capital investment. Additionally, there are limits to spatial resolution for physically pixelated arrays that depend upon the structural integrity of the LED material, the capabilities of the etching equipment, or both. Further, physically pixelated arrays of LEDs may be inefficient in transporting heat created upon activation due to their independent thermal pathways. In contrast, the EPLDs described herein may allow for lower cost and higher resolution, as well as providing better heat-spreading ability. Furthermore, physical pixelation may lead to decreased lifetime through the growth of dislocations.

If one assumes a 2 μm square pixel dimension, then an average defect density of $2.5 \times 10^7$ defects/cm$^2$ will mean that, on average, there will be 1 defect per pixel and it is statistically possible for some pixels to have several defects while others have none. Any pixel having too many defects through the active region may not emit light as efficiently as the other pixels, or may even not emit light at all. In order to achieve a desired low level of defective pixels, it may be advantageous to use semiconductor materials that are fabricated with low defect density (for instance, a defect density equal to, or less than, the pixel density). It may be further advantageous to use semiconductor materials that have a defect density less than 0.1, 0.01, 0.001, 0.0001, 0.00001, or 0.000001 times the pixel density.

The EPLDs described herein are based on light emitting diodes. The physics of semiconductor diode junctions and light emitting diodes will be described here only briefly. For a more complete description see, for example, E. F. Schubert, *Light Emitting Diodes*, 2006; and S. M. Sze, *Physics of Semiconductor Devices*, 1981.

A semiconductor is a material with electrical conductivity between that of a metal and an insulator. The electronic properties of semiconductors derive from the presence of a bandgap between the valence band and the conduction band. In order for the semiconductor to carry a current, an electron must move from the valence band to the conduction band. At room temperature in a pure semiconductor, very few electrons are present in the conduction band. A pure (intrinsic) semiconductor is generally an insulator. The addition of small quantities (typically <1 at. %) of appropriate dopant atoms, however, will significantly increase the conductivity of a semiconductor at room temperature. The presence of the dopant atoms provides free carriers that can carry the flow of electricity in the semiconductor. Depending on the semiconductor and the type of dopant, the dominant charge carrier will be either electrons that are added to the conduction band or holes that are created in the valence band (a hole is the absence of an electron in an otherwise filled band). Dopants that provide electrons are known as "donors" while dopants that create holes are known as "acceptors". An "n-type" semiconductor has been doped with donors and a "p-type" semiconductor has been doped with acceptors.

A diode is formed when a p-type and n-type semiconductor are placed in electrical contact. The contact interface between the p- and n-type semiconductors is called the diode junction. A diode has the property that it will allow electrical current to flow in one direction through the diode junction with very little apparent resistance. Current will flow through the diode when it is biased (i.e., connected to an external voltage) in a way that provides electrons to the n-type side of the junction and removes electrons from the p-type side of the junction. This condition is known as operating the diode under "forward bias". When operated under the opposite bias ("reverse bias") the diode has much higher resistance and only a very small leakage current will flow through the junction.

A diode can be generally classified by the nature of the junction layer. The simplest type of junction is a homo-junction, which is formed between n- and p-type regions in the same semiconductor material. The composition of the semiconductor (and therefore the bandgap) is the same across a homo-junction with only the dopant type and concentration varied. A junction between two semiconductors with different compositions and different dopant types and concentrations is a hetero junction (for example, a junction between GaAs and AlGaAs). A double-heterojunction (DH), also known as double-heterostructure, diode is made of two adjacent heterojunctions. An example of a double-heterostructure is a 100 nm thick $In_{0.06}Ga_{0.94}N$ layer (i.e., the intermediate layer) between n-type $Al_{0.15}Ga_{0.85}N$ and p-type $Al_{0.15}Ga_{0.85}N$, described in Nakamura, *J. Vac. Sci. Technol. A* 13, 705. The bandgap of the intermediate material in a double-heterojunction determines the wavelength of the emitted light.

Diode junctions may also include a single-quantum-well (SQW) or multiple-quantum-wells (MQW) between the p- and n-type semiconductors that form the junction. A quantum well is a thin layer of semiconductor (usually undoped) sandwiched between barrier layers of semiconductors (which may be adjacent or immediately adjacent [e.g., in physical contact]), with a smaller bandgap for the quantum wells than for the adjacent layers. As used herein, the term adjacent is broader than and subsumes the term immediately adjacent.

Electrons and holes injected into the quantum well are confined and are more likely to recombine radiatively. The band gap energy of the quantum well is determined by the thickness of the quantum well and also by the composition of the semiconductors in the well and on either side of the well. The energy of light emitted can be controlled by adjusting the layer thickness during growth of the device and by choosing the composition of the quantum well layers.

An example of a single quantum well structure is 3 nm thick $In_{0.45}Ga_{0.55}N$ between n-type GaN and p-type $Al_{0.2}Ga_{0.8}N$ described in Nakamura, *Jpn. J. Appl. Phys.* 34, L1332. An example of a multiple quantum well structure is ten periods of 2.5 nm thick $In_{0.2}Ga_{0.8}N$ wells and 7.5 nm thick $In_{0.05}Ga_{0.95}N$ barriers between n-type GaN and p-type GaN layers as described in Chichibu, *Appl. Phys. Lett.* 69, 30.

Junction designs that have reduced current droop (such as the type described in Gardner, N. F., *Appl. Phys. Lett.* 91, 243506.) could be used to increase the efficiency of an EPLD.

A light-emitting diode is a type of diode that emits light when it is operated with a forward bias. Light emission occurs when an electron from the n-type semiconductor recombines with a hole from the p-type semiconductor. The electron from the conduction band fills the hole in the valence band and the electron emits the energy difference between the conduction and valence bands as either a photon of light (radiative recombination) and/or as heat (non-radiative recombination). Generally, recombination is most likely to occur near the junction. Recombination in some semiconductors produces almost no light, but in others, an appreciable amount of light is emitted. Examples of semiconductors that have been used to make light emitting diodes include: GaAs, AlGaAs, InGaAs, InGaAlP, GaN, AlGaN, InGaN, ZnSe, CdZnSe, ZnO, and SiC.

The efficiency of the EPLDs described herein may be greater than physically pixelated devices. For instance, the minority hole diffusion length in GaN has been reported to be around 1 µm. Thus, a 2 µm pixel will suffer significant efficiency loss from surface recombination, which provides an additional non-radiative recombination pathway for carriers in the active layer within about the diffusion length of the surface. While there are methods for reducing surface recombination in physically pixelated devices (e.g., providing a surface layer or surface treatment that passivates the surface states and reduces the likelihood of surface recombinations), such methods increase the costs and complexity of manufacturing. The EPLDs of the present description eliminate such surface recombination by not etching through the active layer, therefore not forming the surfaces on which such inefficient recombinations occur.

In one embodiment of the EPLDs described herein, the p-type layer may be etched partially or completely without etching the active layer. As used herein "partially etched" means etched through some part of the thickness without etching through the entire thickness of a layer. "Completely etched" means etched through the entire thickness of a layer. This p-type layer etching increases the sheet resistance of the p-type layer in the etched regions and further reduces current spreading. This method can be used to improve current confinement in a thicker or more highly doped p-type layer. Etching the p-type layer does not introduce surface states in the active region, so it will not cause the surface recombination that complete physical pixelation introduces. The p-layer electrode contact metal may be used as a self-aligned mask, simplifying the fabrication step for partially or completely etching the p-type layer.

Without wishing to be bound by theory, it is believed that in addition to this inefficiency, surface recombination may also increase the diode ideality value. See, for instance, Jin, *Appl. Phys. Lett.* 78, 22. The current spreading length is proportional to the diode ideality value. Therefore, physical pixelation may also increase the spreading length for a given device. This loss of current control (and thus loss in contrast) may be mitigated in the EPLDs described herein vis á vis physically pixelated devices.

One potential challenge in generating EPLDs without physically etching column-like micro LEDs is controlling the desired light output. For this reason, it may be desirable to utilize optical elements to collimate the light generated in the active region of the LED. Collimation may allow, for instance, for direction of the light generated and decrease optical cross-talk between LED segments. Optical cross-talk refers to the spreading of light from one pixel into neighboring pixels that can reduce the color quality and sharpness of an image. The collimation can be achieved through the formation of lenses into the top surface of the LED. A lens formed into the top surface will correspond to a light creation region in the LED that is powered by its own electrode pair or common electrode and corresponding second electrode.

FIG. 1 is a simplified cross-sectional view of an EPLD with an optical element to collimate emitted light. It will be appreciated that within the depicted cross section of EPLD 101 is a single light creation region 102. Here an optical element, e.g. a lens, has been formed into the output surface of EPLD 101. The optical element 103 is positioned to redirect some of the light emitted 106 from the light creation region 102. In this figure the optical element 103 is shown collimating the emitted light 106 to form a narrower, directed beam of light 104.

Figure 2:
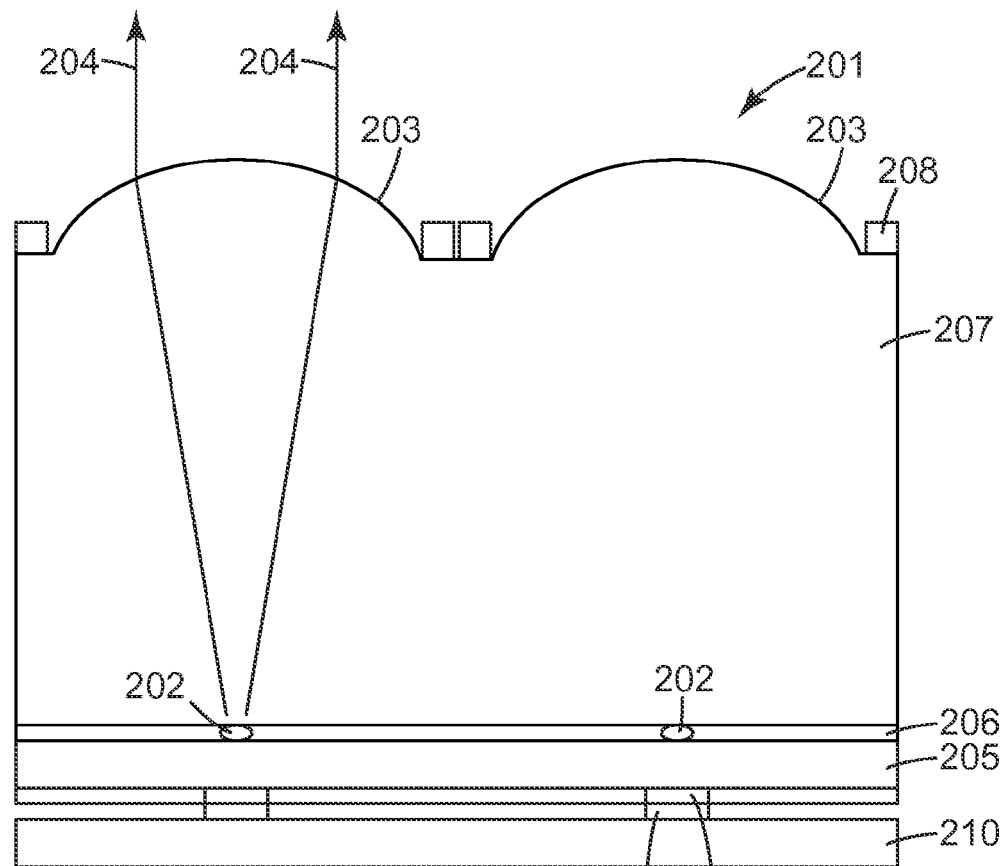
FIG. 2 is a cross-sectional view of an EPLD with multiple optical elements.

FIG. 2 provides a more detailed cross-sectional view of an EPLD with multiple optical elements to collimate emitted light. In this embodiment, EPLD 201 is provided having continuous light emitter region 206 disposed between p-doped layer 205 and n-doped layer 207. Disposed on p-doped layer 205 are a number of individually addressable p-layer electrodes 209. The electrodes 209 are electrically connected to circuit board 210 by means of electrical connection 211. The top face of the n-doped layer is formed into optical elements 203, such as a lens in order to collimate and direct light 204 leaving the EPLD. Also atop the n-doped layer 207 are n-layer electrodes 208.

Upon supplying current to individually addressable p-layer electrodes 209, light is created in continuous light emitter region 206 at light creation regions 202. The light created at light creation region 202 is then emitted from the optical element face 203. Light being emitted may be collimated and directed by the optical element, reducing optical cross-talk between regions corresponding to different light creation regions 202.

Light may also be directed toward the face comprising the plurality of individually addressable electrodes and/or may be waveguided in the LED layers. In such instances, the extraction efficiency of light from the EPLD may be enhanced by such methods as putting a reflective coating or reflective material on the EPLD on the face comprising the plurality of individually addressable electrodes.

In the embodiment depicted in FIG. 2, the n-doped layer is shown located proximate the emission face and thus may be referred to as an outer semiconductor layer. The p-doped layer, positioned on the side of the active region distal to the emission face, would in this embodiment be referred to as an inner semiconductor layer. The ability to individually address individually addressable electrodes 209 allows for the creation of unique spatial light output profiles for different voltage inputs. Such spatial control of the light output by electrical pixelation may be useful in applications where light emission is imaged, such as in a projection device. Spatial control of the light output by electrical pixelation may also be useful in applications where the light is angularly directed, such as when delivered to a lens or other optic that translates light emission position into light output direction.

For the sake of simplicity, FIG. 2 shows light creation region 202 as a non-overlapping oval that is symmetric about the center line of individually addressable electrodes 209. In operation, however, the shape of light creation region 202 may be any shape and may be symmetric or asymmetric about the center line of individually addressable electrodes 209. Further, adjacent light creation regions 202 may spatially overlap.

In FIG. 2, continuous light emitter region 206 is disposed between p-doped layer 205 and n-doped layer 207. When a potential is applied between an individually addressable electrode 209 and n-layer electrode 208, holes flow from the individually addressable electrode, through the p-doped layer 205 and into light emitter region 206 and electrons flow from the n-layer electrode 208, through the n-doped layer 207 and into the light emitter region 206. In the light emitter region 206, electrons and holes may recombine and produce light which may be in the visible region, the infrared region, or the ultraviolet region.

Continuous light emitter region 206 may be any suitable structure, including, for instance, a single quantum well, a multiple quantum well, a homojunction, a heterojunction, a double heterojunction, and the like. The layer may be comprised of, for example, alternating sub-layers of GaN and InGaN. Alternating the two materials in, e.g. a multiple quantum well, creates a bandgap corresponding to a particular emission wavelength. It could also be comprised of, for example, a single layer of epitaxially grown GaN or InGaN.

Other suitable materials for the continuous light emitter region may include, but are not limited to, silicon (Si), germanium (Ge), aluminum gallium nitride (AlGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

In some embodiments, it may be advantageous to select approximately lattice matched semiconductors for the p-type layer, the n-type layer, and the continuous light emitter region. This may be achieved, for instance, by building the EPLD on entirely the same semiconductor family. Appropriate semiconductor families include Group IV semiconductors, III-V semiconductors, and II-VI semiconductors. All binary, ternary, or quaternary alloys based on group IV, group III-V or group II-VI semiconductors are contemplated herein and can be chosen by one of skill in the art. Thus, while throughout this specification specific semiconductor materials are described as suitable for the n-type semiconductor layer, the p-type semiconductor layer, and/or the continuous light emitter region, it should be understood that the particular materials chosen are not limited to those specifically enumerated and instead the choice of materials should be guided by the entirety of the description, including the selection of approximately lattice matched materials.

In FIG. 2, p-doped layer 205 is in contact with individually addressable electrodes 209 and continuous light emitter region 206. Typically, the individually addressable electrodes 209 will be deposited onto the p-doped layer 205 by, for example, e-beam evaporation. Metals used for contacts for both the p-type layer and/or the n-type layer may be selected from, for instance, Au, Ag, TI, Au/Ti, Au/In, Au/Ni, and Cu.

For each of the EPLDs described herein, an annealing step after the deposition may be used to reduce the contact resistance between individually addressable electrodes 209 and p-doped layer 205. When the contact resistance of the p-contact is kept as low as possible, the operating voltage of the pixel may be reduced and thus the efficiency of the system increased. High contact resistance may lead to ohmic heating which can waste energy and lower the efficiency of the EPLD device at the diode junction by increasing the operating temperature. Ohmic heating may also decrease the lifetime of an LED device, particularly a physically pixelated LED device unable to effectively dissipate such heat, by increasing the rate of growth of threading dislocations.

Further, for each of the EPLDs described herein, having a small p-contact, will help to confine the current to the portion of the active region directly above the p-contact. Some current spreading will occur in the EPLDs described herein, and the current will flow through a region of the active region that is larger than the p-contact. Thus, when the p-contact is smaller than the desired pixel size, the contrast is improved by minimizing the spread of current to adjacent pixels, which can, in part, be accomplished by using small p-contacts.

Light output may also be increased by making the p-contact layer reflective. The insulating area around the p-contact may also be reflective by using a dielectric stack mirror or by depositing a thin insulator around the p-contact and then coating a reflective metal (which may be the same as the p-contact metal) over the insulator (of course, taking care not to short out the individually addressable electrodes).

P-doped layer 205 may be any suitable LED material, such as Mg-doped GaN. Other suitable materials include p-doped silicon (Si), germanium (Ge), aluminum gallium nitride (AlGaN), indium gallium nitride (InGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

In FIG. 2, n-doped layer 207 is in contact with continuous light emitter region 206 and n-layer electrode 208. Typically, the n-layer electrode 208 will be deposited onto n-doped layer 207 by, for example, e-beam evaporation. As noted above, metals used for contacts for the p-type layer and/or the n-type layer may be selected from, for instance, Au, Ag, Ti, Au/Ti, Au/In, Au/Ni, and Cu. An annealing step after the deposition may be used to reduce the contact resistance between the n-layer electrode 208 and the n-doped layer 207. N-doped layer 207 may be any suitable LED material, such as Si-doped GaN. Other suitable materials include, but are not limited to n-doped silicon (Si), germanium (Ge), aluminum gallium nitride (AlGaN), indium gallium nitride (InGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

The sheet resistivity of the p-doped layer 205 has a large influence on the current spreading in an EPLD. A p-doped layer with higher sheet resistivity will have less spreading than a p-doped layer with lower sheet resistivity. The sheet resistance, $R_s$, of the p-doped layer is calculated from the bulk resistivity, $\rho$, of the p-doped material and the thickness, t, of the p-doped layer.

$$R_s = \frac{\rho}{t}$$

The diode ideality factor also influences the current spreading; however this is a more difficult parameter to control and will depend on the type of semiconductor and the growth conditions, among other factors.

In, for instance, GaN semiconductors, the majority of current spreading occurs in the p-type layer. Making this layer thinner will increase sheet resistivity and therefore reduce current spreading.

In some embodiments, it is advantageous to avoid making the p-type layer thinner than the depletion layer width in the p-type layer. Further, a low doping concentration in the p-type layer increases the resistance and reduces the current spreading. A low doping concentration also increases the depletion width, however, so consideration must be given to both the thickness of the p-type layer and the doping concentration. The resistance from low doping concentrations increases faster than the depletion width. Accordingly, a p-type layer having low doping concentration may be more resistive than a highly doped p-type layer, even if the lower-doped layer requires a thicker layer in order to be thicker than the depletion layer width.

The cavity effect can increase light output and also provide collimation of the light inside the high-index structures which may also reduce light spreading. The cavity effect is accentuated when the light emitting area is located at a specific distance from the p-contact metal, so one may wish to choose the p-type layer thickness so as to maximize this effect. See for example the description by Y. C. Chen et al. Applied Physics Letters, 82, 2221 (2003). The thickness of the p-type layer can be set to the desired value for maximizing the cavity effect and the doping level of the p-type layer can be adjusted to achieve the desired sheet resistivity to minimize current spreading In some cases the distance between the light emitting area and the p-contact metal is between about 0.6 and 0.8 times or about 1.2 times the emitting wavelength in the material.

While FIG. 2 and the discussion above relates to the n-type layer as the emission face or outer layer, it will be understood by those of skill in the art that the p-type layer may instead by the emission face or outer layer. In such an embodiment, the individually addressable electrodes would be n-layer electrodes and the optical elements provided to receive emitted light would be arranged on or etched into the p-type layer.

FIGS. 3a-3e are cross-sectional views of EPLDs with various optical element shapes, sizes, densities and distribution configurations. The figures are illustrative of the potential for varying the shapes, size, density and distribution of optical elements 303 which form part of the EPLD in order to achieve the desired light output from the device.

In FIGS. 3a-3e, p-type layer 305 is illustrated as an inner layer and n-type layer 307 is illustrated as an outer layer. As discussed above, such a configuration is not the only one contemplated by the present application. The p-type layer may be the outer layer and the n-type layer may be the inner layer in embodiments contemplated by this application. Continuous light emitting region 312 is shown sandwiched between p-type layer 305 and n-type layer 307. Optical elements 303 are illustrated as receiving light from a corresponding light creation region 302. Further, it will be understood that optical elements 303 in FIGS. 3a-3e may be of the same material as the n-type layer (or the p-type layer when the p-type layer is the outer layer), or may be modular elements that are placed above a relatively planarized outer surface to receive light from light creation region 302.

Figure 3A:
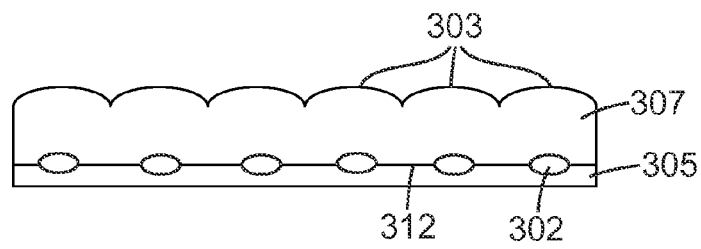
FIGS. 3a-3e are cross-sectional views of EPLDs with various optical element configurations.

FIG. 3a, for example, illustrates a convex or hemispheric lens with consistent spacing, size and density as optical elements 303. Such a formation may provide for collimated and directed light received from light creation regions 302. Such an system of optical elements may be valuable for pixelation.

Figure 3B:
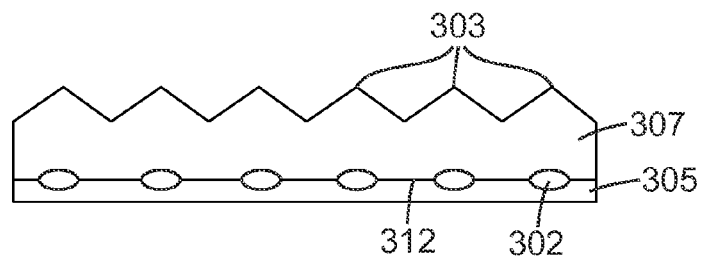

FIG. 3b provides another option with regard to the shape of optical elements 303. Here, optical elements 303 are depicted as pyramidal.

Figure 3C:
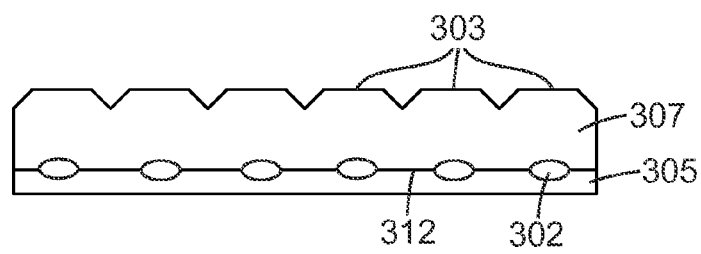

FIG. 3c provides an embodiment of regularly spaced optical elements in the form of truncated pyramids.

Although not shown, in order to better prevent light mixing between light creation regions 302, the EPLD may also include a light blocking element placed in between light creation regions 302 running vertically through n-doped layer 307. Such a light blocking element will preferably be reflective and have low absorption to avoid losses. Of course, such reflective elements would not, according to the present disclosure, extend into continuous light emitting region 312, since continuous light emitting region 312 is continuous and such interruption would cause a discontinuity of the light emitting region.

Figure 3D:
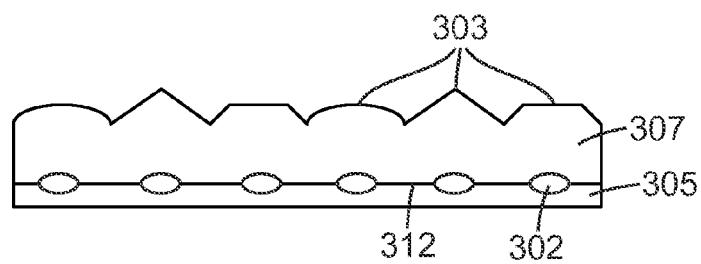
Figure 3E:
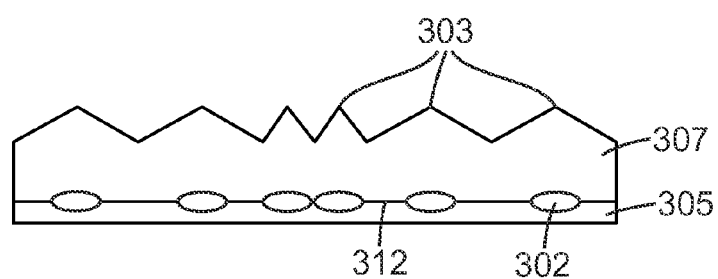

FIGS. 3d and 3e illustrate examples of EPLDs which have varying shapes and/or sizes for optical elements 303. Such embodiments may be useful to create a desired lighting pattern, such as a lighting pattern that is the combination (superposition) of patterns created by optical elements having different shapes or sizes.

Density and distribution of the optical elements may be varied as well. The optical elements can be tailored to modify the emitted light through reflection, refraction, and/or diffraction. Such light modification may result, for instance, in collimation of light output, light-recycling, light shaping and/or polarization.

Other potentially useful shapes besides those illustrated explicitly in the Figures, may include cones, truncated cones and Fresnel lenses, or other suitable shapes known in optical design. Fresnel lenses may be especially useful, for instance, in collimating light while maintaining a small lens thickness. Optical elements will generally be wider than the light creation region of the EPLD.

The optical elements may include diffractive optics such as binary optics, diffraction gratings, holographic optics, and zone plates. Such optical elements may also be useful in collimating or directing the emitted light. When diffractive optics are used, the area covered by the diffractive structure will generally be larger than the light creation region; however, the individual features of the diffractive optic may be smaller than the light creation region.

The light creation regions 302 in FIGS. 3a-3e are depicted as located on a single continuous diode junction rather than in a separate continuous emitter region. It should be understood that this diode junction can be any of the types of junctions described herein including a homojunction, a heterojunction, a double heterojunction, a single quantum well junction, or a multiple quantum well junction.

While FIGS. 2 and 3a-e show embodiments wherein the individually addressable electrodes are attached to the surface distal to the emission face in the EPLD, it will also be understood that the light emission face and the face comprising the plurality of individually addressable electrodes may be the same. Such an embodiment may provide an emission surface in closer physical proximity to the light emitter region in an EPLD (for instance, when the plurality of individually addressable electrodes is attached to the p-type layer, because the p-type layer is typically thinner than an n-type layer for a given device).

Further, when the plurality of individually addressable electrodes is located on the emission face, the circuitry for individually addressing the individually addressable electrodes may act as a mask, providing some optical separation between the electrically pixelated pixels. In such an embodiment, it may further be desirable to add a reflective layer to the non-emission face to increase the light output by redirecting light that is generated in the light emitter region but that is initially directed to the non-emission face.

Figure 4A:
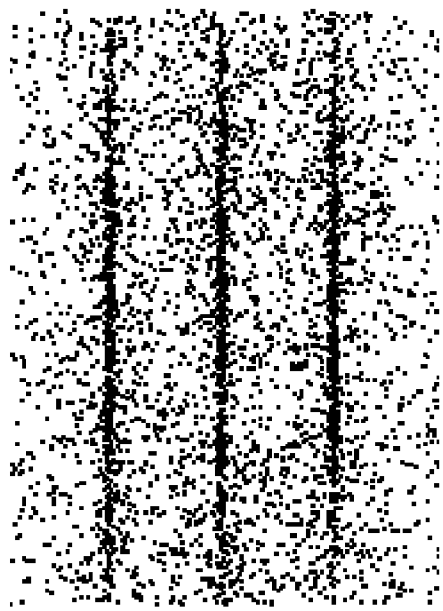
FIG. 4a is a plot of modeling results for the EPLD of FIG. 4b.
Figure 4B:
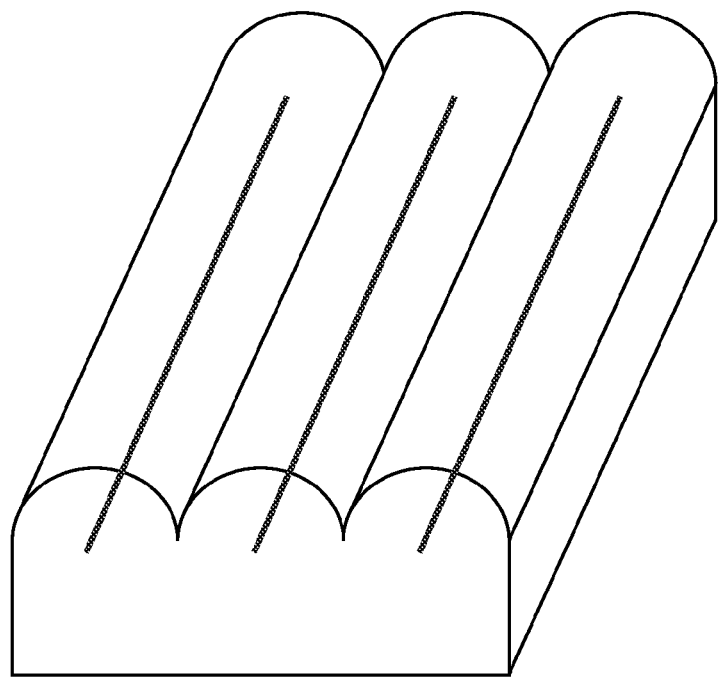
FIG. 4b is a view of an EPLD using half-cylinder optical elements over light creation regions.

FIG. 4b is a view of an EPLD using half-cylinder optical element over light creation regions for collimated strip creation. Here, the light creation regions, rather than being discrete points, form a line running the length of the EPLD. This may be accomplished by providing individually addressable electrodes that also run the length of the EPLD. In correspondence with the line-shaped light creation regions, optical elements are formed in the shape of half-cylinders running along the same axis as the light creation regions. Here the highest point of the optical elements is illustrated as being centered over the light creation regions. The resulting light emission pattern can be seen in the modeling plot depicted in FIG. 4a. The result of this embodiment as illustrated is the formation of light strips corresponding to the light creation lines. These strips are projected by the collimation and direction of the half-cylinder optical elements. The modeling plot depicted in FIG. 4a was prepared using the same modeling software used in the Examples below. In the plot illustrated in FIG. 4a, the dark spots correspond to individual light rays projected onto a common plane.

Figure 5A:
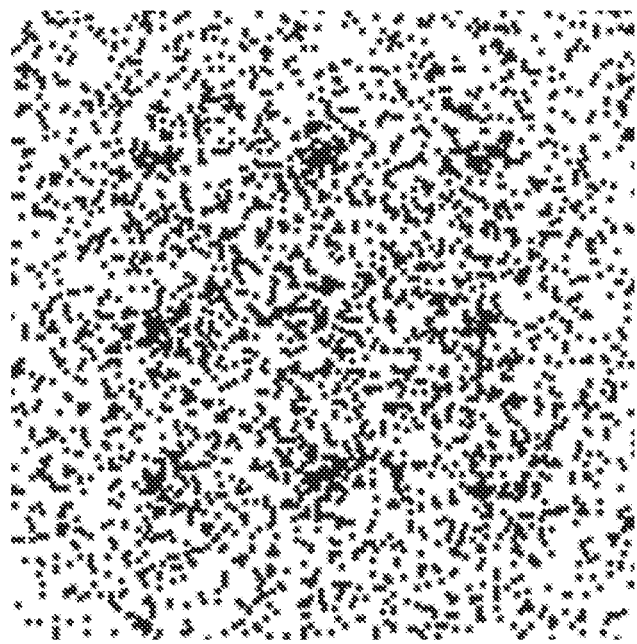
FIG. 5a is a plot of optical modeling results for the EPLD of FIG. 5b
Figure 5B:
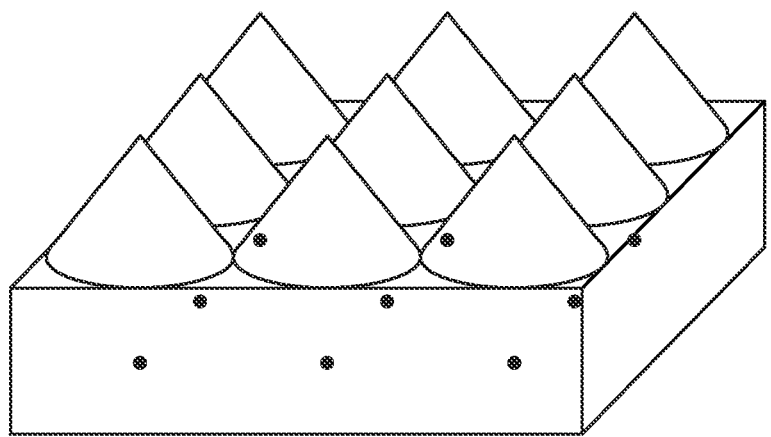
FIG. 5b is an EPLD using conical optical elements over light creation regions.

FIG. 5b is an EPLD using conical optical elements over light regions. The modeling results are shown in the plot illustrated in FIG. 5a. These results indicate a higher concentration of light at points directly above the cone's apex, which may be a desired result for collimation of light rays and prevention of optical cross-talk. Again, in FIG. 5a, the dark spots correspond to individual rays projected onto a common plane.

Figure 6:
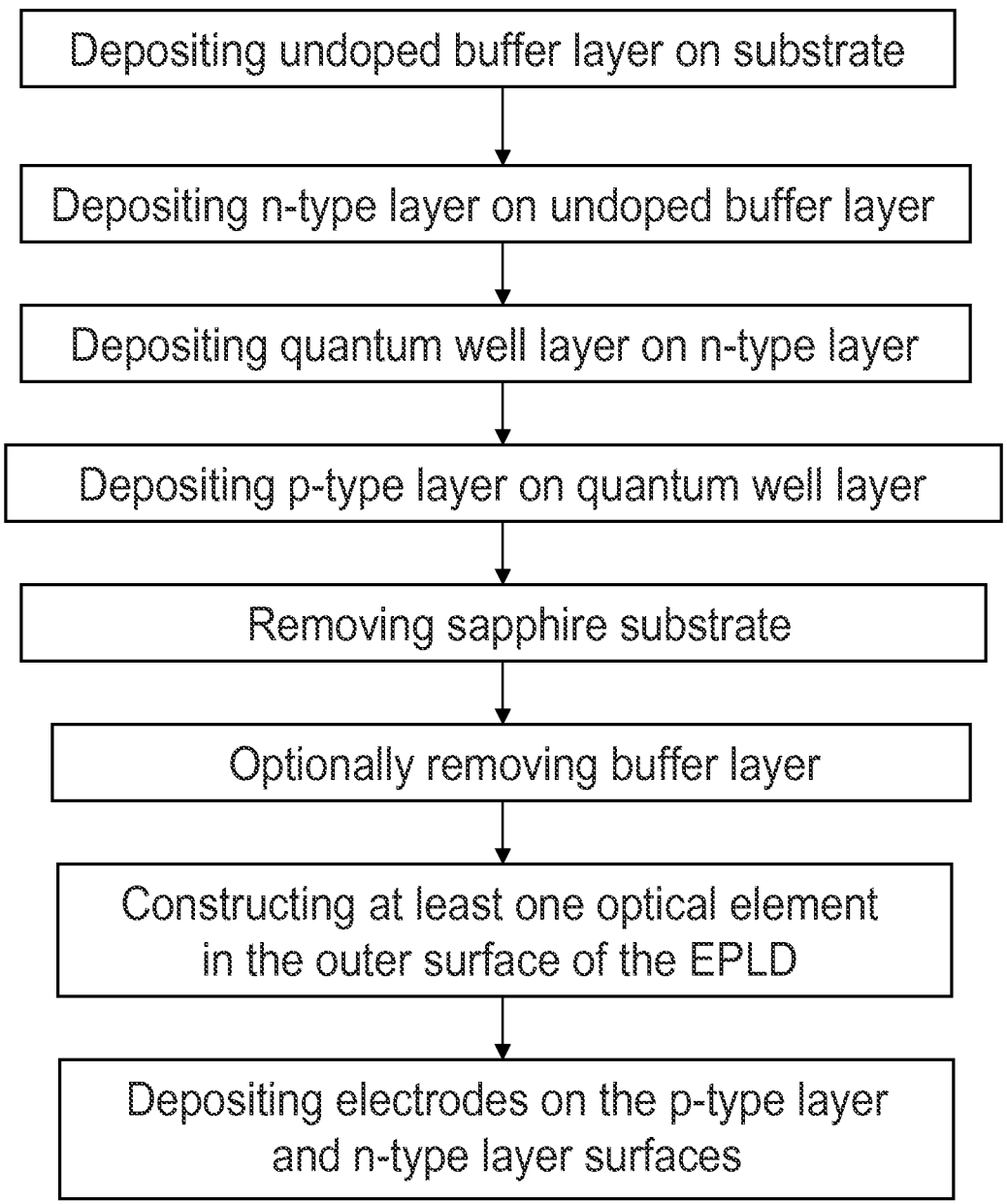
FIG. 6 is a flow chart illustrating the process for fabricating an EPLD device.

FIG. 6 is a flow chart illustrating a representative process for fabricating an EPLD device according to the present description. The process may be further understood by reference to FIGS. 7a-7h, which illustrate an EPLD device at various intermediate stages of fabrication.

FIGS. 7a through 7h provide a step-by-step illustration of various intermediate structures for one embodiment of a process for fabricating an EPLD according to the present description. In this embodiment it is assumed that the EPLD will be made in a nitride semiconductor. An EPLD made in a different semiconductor family may require different process steps following the general principles described in the present application, as will be known to those of skill in the art.

First, optional un-doped buffer layer 1070 is disposed on substrate, 1080. Such disposition may be accomplished by any suitable method, including metallo-organic chemical vapor deposition (MOCVD), hydride vapor phase epitaxy (HVPE), metallo-organic vapor phase epitaxy (MOVPE), metallo-organic molecular beam epitaxy (MOMBE), and atomic layer deposition (ALD). The disposition of a buffer layer may not be necessary and is a design option available to a skilled artisan for fabricating such devices.

Substrate 1080 may be any suitable materials, such as, for example, sapphire, SiC, ZnO, LiAlO$_2$, AlN or GaN. A typical substrate thickness is around 0.5 mm thick, but the thickness may be chosen based upon ease of handling, cost, or other factors.

A thin low temperature GaN seed layer may be disposed on a substrate before the subsequent layers are epitaxially grown, for instance, when epitaxial growth is the chosen method for fabrication.

Optional un-doped buffer layer 1070 may be any suitable material selected based upon the material used for substrate 1080 and on the type of materials used in the remainder of the LED. For instance, un-doped GaN may be a suitable material for optional un-doped buffer layer 1070. A typical thickness of an undoped GaN buffer layer is around 2 μm.

Figure 7A:
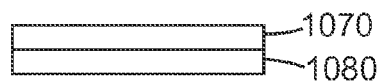
FIGS. 7a-7h are schematic representations of devices at various stages or steps in a process for fabricating an EPLD device.
Figure 7B:
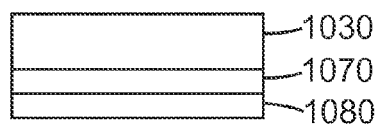

In FIG. 7b, n-doped layer 1030 is disposed on optional un-doped buffer layer 1070. Suitable materials and deposition methods are those described throughout this description for n-type layers. In one embodiment, the n-type GaN layer may be produced by Si-doping. A typical thickness of an n-doped layer is around 2 μm thick. Thus, it will be understood that the illustrated intermediates in FIGS. 7a-7h are not shown to scale. In particular, while optional un-doped layer 1070 and n-doped layer 1030 may be similar in thickness, FIG. 7b shows the n-doped layer 1030 as thicker than optional undoped layer 1070.

Figure 7C:
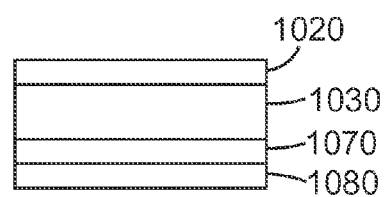

In FIG. 7c, quantum well layer 1020 (single or double quantum well) is disposed on n-doped layer 1030. A typical total layer thickness for the quantum wells and barrier layers is in the range of 40 to 100 nm.

It is understood in the art that the term quantum well refers to a potential well that confines particles in two dimensions (in this case electrons and/or holes), which were originally free to move in three dimensions, forcing them to occupy a planar region (so-called quantum confinement). The effects of quantum confinement take place when the quantum well thickness becomes comparable at the de Broglie wavelength of the carriers (generally electrons and holes) leading to energy levels called "energy subbands" (i.e., the carriers can only have discrete or quantized energy values). Quantum wells are formed in semiconductors when a material, such as gallium arsenide, is sandwiched between two layers of a material with a larger bandgap, like aluminum arsenide. These structures can be disposed, for example, by growth techniques such as those discussed above, with control of the layer thickness down to monolayers.

Not shown in FIGS. 7a-7h, but available to one of skill in the art, is the addition of an electron blocking layer grown on the quantum well layer. The electron blocking layer (EBL) is an optional layer that can help increase the efficiency of nitride-based LEDs. The EBL may be made using AlGaN or any other material that provides a potential barrier for electrons to diffuse out of the active region. A typical thickness of the EBL layer is about 50 nm.

Figure 7D:
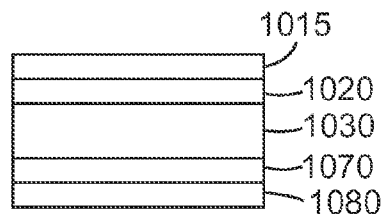

In FIG. 7d, p-doped layer 1015 is then disposed on quantum well layer 1020. Suitable materials include those discussed above, such as Mg-doped GaN. Suitable disposition methods are those outlined throughout this description. A typical thickness of the p-doped layer is about 250 nm.

Figure 7E:
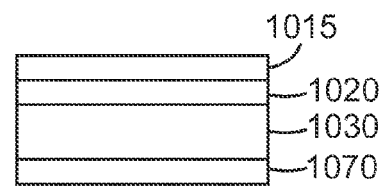

FIG. 7e shows substrate 1080 removed from the rest of the device. This step can be accomplished through a number of techniques, including, e.g., chemical-mechanical polishing, etching, and laser-lift-off using an excimer laser. In laser lift-off, for instance, due to the difference in the absorption coefficients between the substrate and optional buffer layer (or n-doped layer when a buffer layer is not used) material at the excimer laser wavelength, the majority of the energy from the laser is preferentially deposited into the interface between the substrate and the buffer layer of the LED device. This effectively separates the LED device from the substrate.

At this stage, the EPLDs described herein have a continuous layer and may be made thick enough (in the n-doped layer, for instance) to be mechanically self-supporting. This allows it to be removed from the growth substrate more easily. This is yet another advantage offered by the presently described EPLDs over physically pixelated devices.

Alternatively, a transfer substrate, either a temporary transfer substrate or a final transfer substrate that will remain attached to the LED device, may be attached to the exposed surface of the LED device located on the opposite face of the growth substrate (in this example, the exposed surface is the p-doped layer 1015.). This may provide the mechanical support necessary for devices that are not mechanically self-supporting, may provide mechanical support for devices for which the remaining processing steps make the inclusion of such a transfer substrate desirable, or may provide other functionality in the final EPLD device.

In some embodiments, it may be desirable to first remove the substrate in manufacturing a vertical LED and then to apply an n-electrode (when the n-doped layer is the emission layer) so as to minimize light spreading in the LED.

Figure 7F:
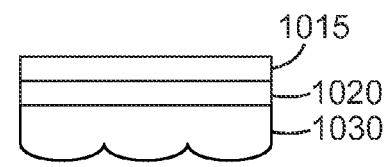

FIG. 7f shows optional un-doped buffer layer 1070 removed from the rest of the device. While not shown, optional un-doped buffer layer 1070 may be thinned to, for instance, 5 to 99% of its original thickness. The removal or thinning may be accomplished by a number of methods, including, e.g., etching away the optional un-doped buffer layer.

At this step of the process, n-doped layer 1030 may also be thinned if desired (not shown). On thinning, the resulting n-doped layer may have a thickness of 5 to 99% of its original thickness. Also at this step, either the n-doped layer 1030 or the un-doped buffer layer 1070 (whether thinned or not) will also be etched into the shape of a desired optical element. If the un-doped buffer layer 1070 is completely removed, optical elements will be formed into the n-doped layer 1030. If the un-doped buffer layer 1070 is not completely removed, optical elements may then be formed into the un-doped buffer layer 1070. Portions of optical elements formed in the un-doped buffer layer 1070 may extend into the n-doped layer 1030, for instance, where etching the emission face through optional un-doped buffer layer 1070 and into n-doped layer 1030. In any of these embodiments, it will be appreciated that the optical elements are being formed into what can be considered the emitting surface of the EPLD. As described throughout this application, the emitting surface of the EPLD may alternatively be the p-doped layer, in which case such etching of optical elements would take place on the outermost face of the p-doped layer.

In the alternative, as discussed elsewhere in this application, modular lenses may be provided separate from the emitting surface of the EPLD and arranged to receive light from the light creation regions of the EPLD.

The optical elements may be formed to be greater in size than at least one light creation region from which it will receive light. Optical elements may correspond to any number of shapes described herein, including, e.g., spherical lenses, aspherical lenses, cones, pyramids, hemispheres, truncated cones, truncated pyramids, Fresnel lenses, and others. Optical elements may be all the same shape or different shapes. Optical elements may be of all the same size or different sizes. Optical elements may be distributed in a uniform or non-uniform pattern and may be either the same or different spatial densities.

In other embodiments it may be preferred to leave the semiconductor layers attached to the growth substrate. In these embodiments the optical elements may be formed directly into the substrate (and further into the optional un-doped buffer layer and n-doped layer as described above for multiple-layer etching). Electrical contacts to the n-doped layer (for instance, on the emission side) may be made directly to the substrate if the substrate is electrically conductive (e.g., SiC), may be made by etching completely through the substrate in some regions, or may be made by etching through the p-doped layer and junction to expose the n-doped layer in some regions (so long as continuity of the continuous light emitting region is maintained).

Patterning optical elements into the n-doped layer 1030 may take place in a single step or a series of steps with intermediate structures formed. One method to create optical elements on a surface is photoresist reflow. In this method, a positive photoresist is applied to a surface (for instance, by spin coating), patterned and exposed using a mask, developed, and heated. The subsequent heating allows the photoresist to flow to form rounded shapes. The patterned structures are then etched to create the optical elements on the n-doped layer 1030 surface.

Another method for patterning optical elements is gray scale lithography. In this process, a photoresist is applied to a surface by any appropriate coating technique, for instance, spin coating. A three dimensional pattern is then created in the photoresist layer either by photo-exposure through a gray-scale mask (a photolithography mask made with multiple levels of optical density) or by various maskless techniques such as laser or electron beam direct writing. The exposed photoresist is developed in a suitable developer to reveal the three-dimensional resist structure. The three dimensional structures are transferred into the underlying material (for example the n-doped layer 1030) by an etching process, for instance, reactive ion etching (RIE).

Figure 7G:
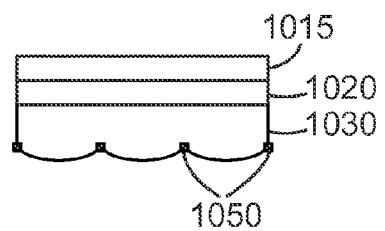

FIG. 7g depicts common electrode 1050 deposited on the emission face of n-doped layer 1030. One potential example of this step would involve depositing a metal grid in what will be inter-pixel regions, then depositing a transparent conductor, e.g., Indium Tin Oxide (ITO), over the remainder of the transmission surface. Another example is depositing a transparent conductor over the entire surface and then depositing the metal grid over the transparent conductor. Since the spacing between the metal grid will be typically small (less than 100 µm) and since the n-doped region typically will have high conductivity, it may not be sufficient in some instances to deposit the metal grid only and not include the transparent conductor layer.

Figure 7H:
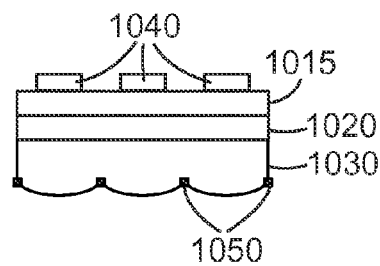

FIG. 7h depicts individually addressable electrodes 1040 attached to p-doped layer 1015. Individually addressable electrodes 1040 may be, for instance, selected from Au, Ag, Ti, Au/Ti, Au/In, Au/Ni, and Cu.

Optionally, a color-converting array may be placed and/or bonded or attached on the emission face of the EPLD (not shown), made with, e.g. II-VI semiconductor materials such as ZnO, ZnSe, ZnS, CdS, CdSe, CdTe, CdZnSe, CdSSe, CdMgZnSe, HgCdTe or ZnSeTe (see U.S. Patent Application No. 2006/0284190) or III-V materials such as AlGaInP. Such color-converting materials can be attached using an optical adhesive to compensate for variations in height. Other bonding techniques could include deposition of a planarization layer for subsequent wafer bonding.

Additional color-converting materials include phosphors, quantum dots, and fluorescent dyes. Suitable phosphors include doped garnets (such as YAG:Ce and (Y,Gd)AG:Ce), aluminates (such as $Sr_2Al_{14}O_{25}$:Eu, and BAM:Eu), silicates (such as SrBaSiO:Eu), sulfides (such as ZnS:Ag, CaS:Eu, and $SrGa_2S_4$:Eu), oxy-sulfides, oxy-nitrides, phosphates, borates, and tungstates (such as $CaWO_4$). These materials may be in the form of conventional phosphor powders, nanoparticle phosphor powders, films, plates made from phosphor powders, or phosphor crystals. Phosphor particles may be mixed with an organic or inorganic binder to form a film for application onto the EPLD. Another class of suitable materials is the so-called quantum dot phosphors made of semiconductor nanoparticles including Si, Ge, CdS, CdSe, CdTe, ZnS, ZnSe, ZnTe, PbS, PbSe, PbTe, InN, InP, InAs, AlN, AlP, AlAs, GaN, GaP, GaAs and combinations thereof. Generally, the surface of quantum dot will be at least partially coated with an organic molecule to prevent agglomeration and increase compatibility with a binder. In some cases the semiconductor quantum dot may be made up of several layers of different materials in a core-shell construction. Suitable fluorescent dyes include those listed in U.S. Pat. No. 6,600,175. Preferred fluorescent dyes are those that exhibit good durability and stable optical properties. The color-converting layer may consist of a blend of different types of color-converting materials in a single layer or a series of layers, each containing one or more types of color-converters.

Additional optical elements, such as projection lenses or micro-lens arrays may be added subsequent to the emission face of the EPLD along the optical path.

In general, an EPLD can be attached or bonded to a color forming array by any suitable method such as by an adhesive such as a hot melt adhesive, welding, pressure, heat or any combination of such methods or other methods that may be desirable in a given application. Examples of suitable hot melt adhesives include semicrystalline polyolefins, thermoplastic polyesters, and acrylic resins.

Other exemplary bonding materials include optically clear polymeric materials, such as optically clear polymeric adhesives, including acrylate-based optical adhesives, such as Norland 83H (supplied by Norland Products, Cranbury N.J.); cyanoacrylates such as Scotch-Weld instant adhesive (supplied by 3M Company, St. Paul, Min.); benzocyclobutenes such as Cyclotene™ (supplied by Dow Chemical Company, Midland, Mich.); clear waxes such as CrystalBond (Ted Pella Inc., Redding Calif.); liquid, water, or soluble glasses based on sodium silicate; and spin-on glasses (SOG).

In some cases, an EPLD can be attached to a color forming array by a wafer bonding technique described, for example, in chapters 4 and 10 of "Semiconductor Wafer Bonding" by Q.-Y. Tong and U. Gösele (John Wiley & Sons, New York, 1999).

As mentioned above, the optical elements may also be modular, formed separately and subsequently bonded to the EPLD.

In one embodiment, the elements are made from a polymeric material. Suitable polymeric materials include polymethylmethacrylate, polycarbonate, polystyrene, silicones, and epoxies. The polymeric material may be formed into the desired shape by a variety of methods including molding, casting, machining, diamond turning, or microreplication. If necessary, the polymeric optical elements may be formed on a substrate (for example a substrate used for continuous microreplication). The substrate may be removed prior to bonding the optical elements to the EPLD. The polymeric optical element may also be formed directly on the emission face of the EPLD by methods including stamping or molding, or by coating the EPLD with a reactive polymer resin and then using a method such as gray-scale lithography to form the polymer resin into a cured polymer having the desired shape.

In another embodiment, the elements are made from an inorganic glass. In a preferred embodiment the glass has a refractive index that is close to the refractive index of the semiconductor used for the EPLD. The inorganic glass may be formed into the desired shape by a variety of methods including molding, sintering, machining, grinding, diamond turning, chemical etching, and sol-gel processing.

The bonding methods described above may be used to bond the externally formed optical element to the EPLD.

Typically, the pixelated surface of an EPLD according to the present description has contact with at least two electrodes. Circuitry connected to the at least two electrodes drives an electrical current to the electrodes and eventually through the continuous light emitting region, locally activating the EPLD. The pixelated surface electrodes may be individually addressed in a number of ways. These include, but are not limited to, direct solder-connection to a circuit board, connection to a complementary metal-oxide semiconductor (CMOS) circuit via various interconnect means, and solder bumps to a package or circuit board. Pixelated surface electrodes may be made of any suitable material known in the art, including but not limited to metals, or metal alloys including: gold, silver, aluminum, nickel, titanium, chromium, platinum, palladium, rhodium, rhenium, ruthenium, tungsten, indium and mixtures and alloys of such. The electrodes may also be formed from transparent conductive oxides such as ITO. Preferably the electrode materials have a high reflectivity so that rays directed to the electrode materials will be reflected by the electrode materials.

The surface opposite the pixelated surface will generally have at least one electrode. This electrode could be, for example, an interconnected metallic or metal alloy grid. The surface opposite the pixelated surface may comprise an electrode that may contain any suitable metal such as gold, silver, aluminum, indium, alloys of any of the foregoing, and/or a transparent metal alloy, or transparent conductive oxide, e.g., Indium Tin Oxide (ITO) covering the surface of the LED.

Using ITO as an electrode over regions of the surface opposite the pixelated surface may allow for the formation of an electrode at the inter-pixel regions, potentially in the form of a grid. Any of the metals mentioned as suitable for the non-emission surface can be used for the metal or metal alloy grid, if desired. The use of transparent metal alloys for emission surface electrodes may be beneficial for providing higher transmission rates of generated light. The electrode could also comprise an array of individually controllable elements, e.g. stripes, allowing for greater current control through the light emitter region. The electrodes on the surface opposite the pixelated surface can be connected through a number of methods, including wire-bonding. However any other number of suitable techniques for electrode connection may be utilized.

It is also possible for both electrode contacts to be made on the same side of the EPLD. In such an embodiment, a portion of the pixelated layer and junction would be removed, for example by etching, to expose the non-pixelated layer. The non-pixelated electrical contact would then be formed on the exposed part of the non-pixelated layer. Electrical contact to both the pixelated and non-pixelated layers would occur from the same side of the device with no electrodes necessary on the opposing face of the device. The optical elements would be located on or coupled to the emission face of the device which could be either the pixelated face or the opposing face depending on device design. This design could be useful when, for example, the optical elements are formed in a non-conductive substrate such as sapphire.

The electrodes will typically be driven with an external controller. When pixelated surface electrodes are addressed by a circuit board, one option may be a CMOS substrate. A CMOS substrate is a substrate comprised of an integrated circuit, and thus may provide dual function of providing a mounting surface for the EPLD as well as an electrical driver. The function of the electrodes of this invention is to provide current through the active light emitter region in a location-adjustable way. Each individually addressable electrode can be seen as having a corresponding switching circuit, through which current flows upon activation. Therefore, the shape and placement of the emission surface and non-emission surface electrodes, as well as the voltage applied to the electrodes are especially important, as these characteristics help to determine the spatial output profile of emitted light.

EXAMPLES

Optical Modeling Examples for Pixelation by Electrode with Lenses

Modeling Method

An optical model of a pixelated vertical LED was constructed in LightTools, an Optical Research Associates ray-trace simulation software, version 6.0. The LED material was simulated by a 90×90 μm slab of gallium nitride with index of refraction of 2.39 and optical density of 0.155 mm$^{-1}$. The sides of the slab were optical absorbers, while the top surface was optically smooth with Fresnel loss and probabilistic ray split as the preferred direction. The bottom surface of the slab was a simple mirror with 85% reflectance. The thickness of the slab was varied in this investigation.

Optical elements were added to the top surface of the slab as a 9×9 texture pattern. Spacing between optical element centers was 10 μm. Types of optical elements included in this investigation were hemispherical lenses, cones, pyramids, and cylinders. Lenses had a radius of curvature of 5 μm. Cones and pyramids had a height and radius of 5 μm. Cylinders had a height of 5 μm and width of 90 μm.

A single source was placed 0.5 μm above the bottom surface at the principle axis of the center optical element in the pattern array. The source was a cuboid with 0.1 μm thickness and varied in length and width for different configurations. The radiometric power of the source was 1.0 Watts measured over the whole sphere. The surfaces of the source were optically smooth with only the top surface emitting rays in a uniform angular and spatial distribution, traced in an outward direction.

Two receivers were included in the model: far-field and near-field. The infinite far-field receiver surrounded the entire slab, collecting longitude data from 0 to 360 degrees and latitude data from 0 to 180 degrees. The near-field receiver was placed 10 μm above the top surface of the optical elements and collected incident rays.

Non-sequential ray traces were used to understand the path of the emitted light. The maximum hits parameter in Light Tools was set to one thousand. One million rays were used in each simulation. Three configurations were modeled to understand how light was affected by optical elements on gallium nitride.

Effect of Source Size

The first model included hemispherical lenses on gallium nitride with the source located at the focal plane under the lenses. The source length and width were varied (i.e. 1×1, 3×3, and 10×10 μm) to understand the influence of source size on collimation. A slab of gallium nitride without lenses and a 1×1 μm source was also simulated to verify Lambertian output from the model.

Figure 8:
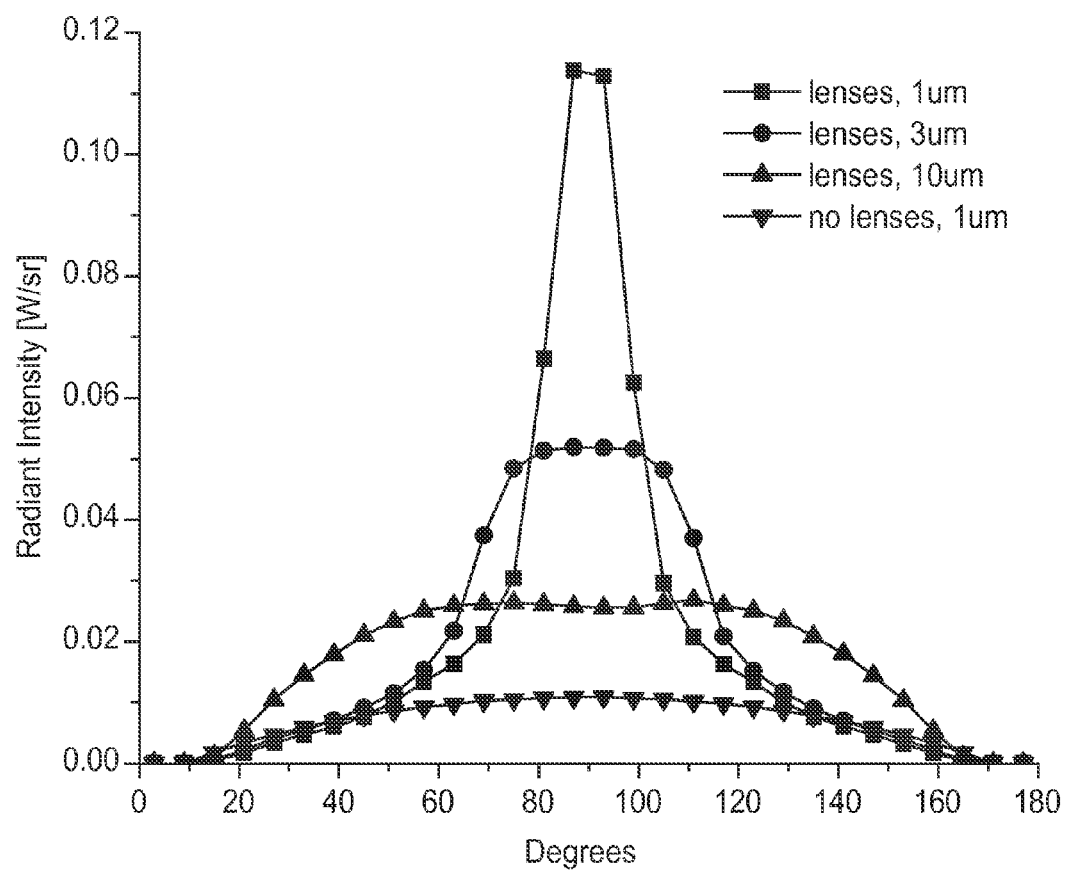
FIG. 8 is a plot of modeling results for various source sizes.

The intensity output on the near-field receiver for each condition is seen in FIG. 8 (Cartesian coordinates). The plot shows that the addition of lenses at the gallium nitride surface increased emitted light intensity by 10%. The increased light intensity was significantly higher for smaller sources than for cases where the source diameter approached the diameter of its respective lens. In addition, less wide angle light was observed for small source sizes, which indicated a collimating effect.

Effect of Optical Element Type

In this model, the source size was held at 1×1 μm at the focal plane under the lenses. The optical element type was varied to understand its influence on the output light.

Figure 9:
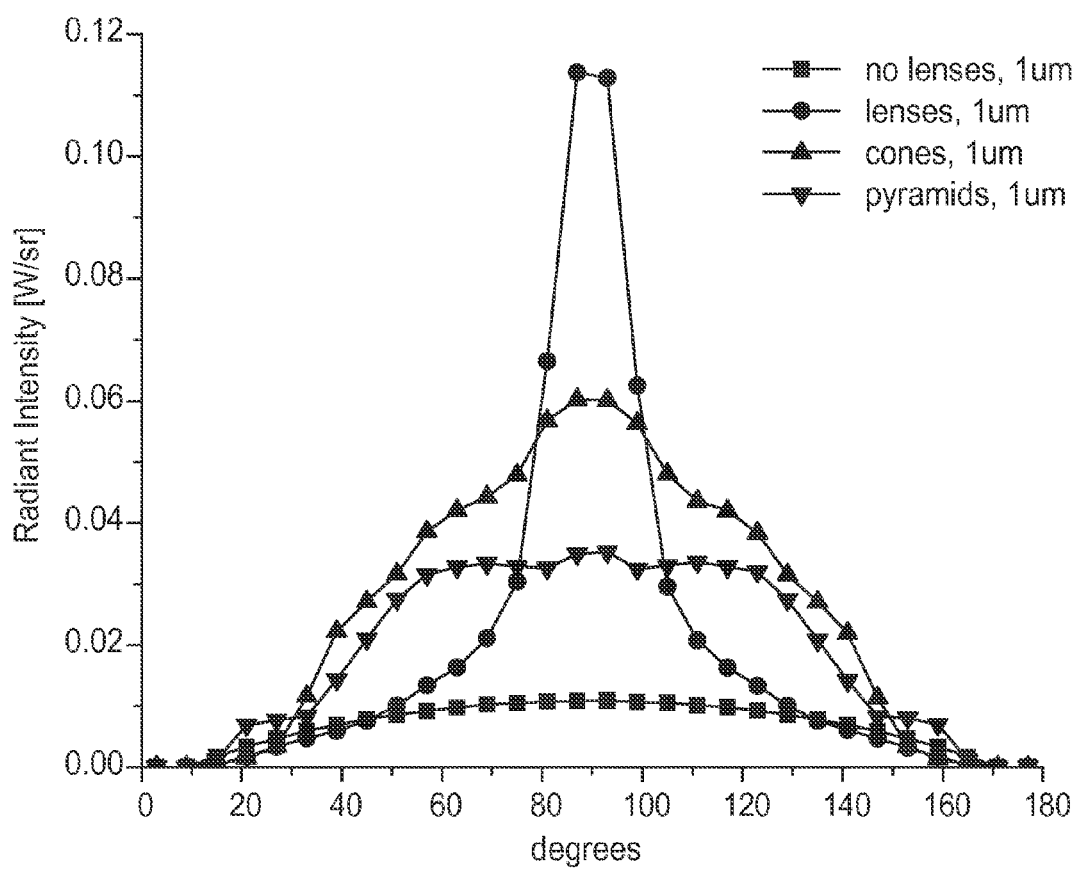
FIG. 9 is a plot of modeling results for various lens shapes.

The intensity output on the near-field receiver for each of these conditions is seen in FIG. 9 (Cartesian coordinates). The plot shows that while the addition of cone or pyramid shapes at the gallium nitride surface are not highly collimated under these conditions, the features at the surface do behave as extraction features, increasing the light output intensity.

Effect of Different Optical Dimensions

To understand how collimation was affected for different optical dimensions, a model was constructed to include 10×90 μm half cylinders with 5 μm height centered over and parallel to 1×9 μm stripe sources. The source was located at the focal plane of the cylinders.

Figure 10:
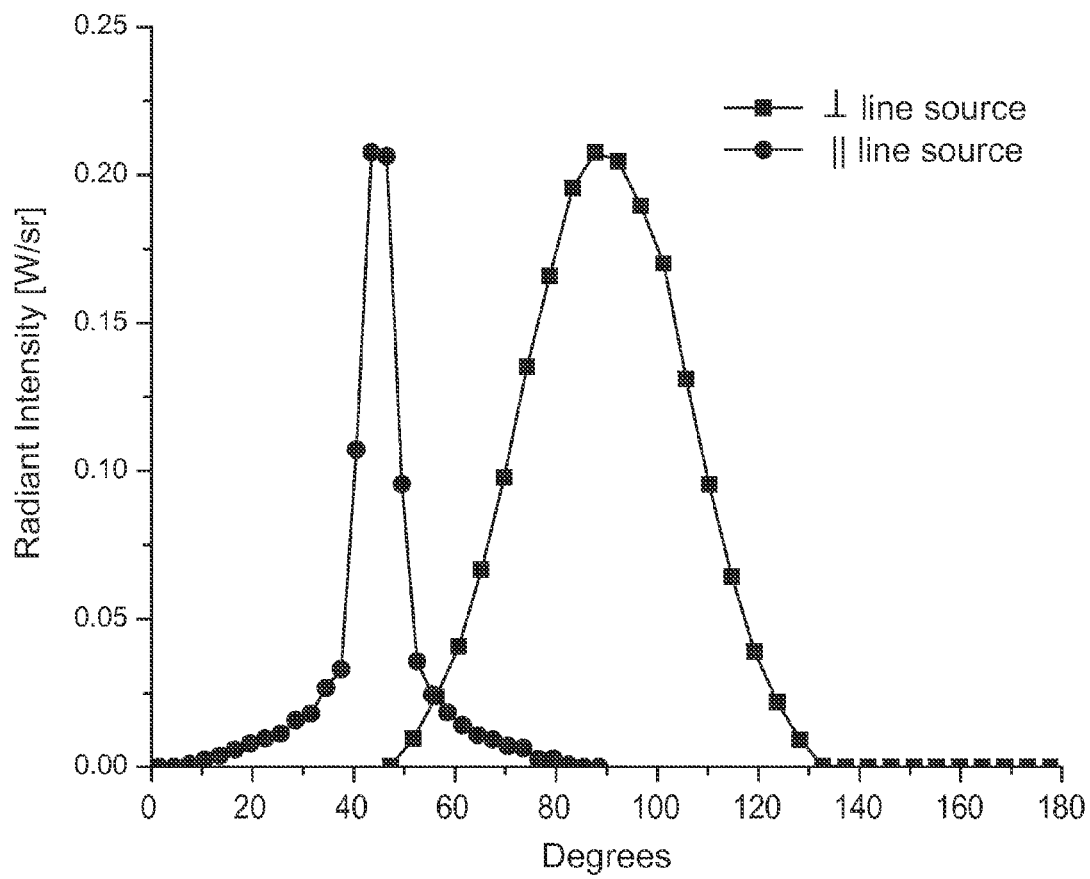
FIG. 10 is a plot of modeling results for lens orientation effects.

The intensity output on the near-field receiver for each of these conditions is seen in FIG. 10. The plot shows the light being emitted parallel to the stripe light source was collimated, while the light perpendicular to the stripe light source was emitted at higher angles.

We claim:

1. An electrically driven pixelated luminescent device (EPLD) comprising:
   a p-layer having a p-layer electrode surface and a p-layer interface surface;
   an n-layer having an n-layer electrode surface and an n-layer interface surface;
   a continuous emitter region with at least one localized light emitting region disposed between the n-layer interface surface and the p-layer interface surface;
   at least one p-layer electrode;
   at least one n-layer electrode;
   wherein at least one of the p-layer electrode or n-layer electrode comprises a plurality of individually addressable electrodes;
   wherein providing an electrical potential difference between the p-layer electrode and the n-layer electrode produces an emitting region within the continuous emitter region; and
   one or more optical elements positioned to receive light from one or more light emitting regions.

2. The EPLD of claim 1, wherein the one or more optical elements are wider than the light emitting region from which they are positioned to receive light.

3. The EPLD of claim 1, wherein the one or more optical elements are formed by etching a surface of the EPLD.

4. The EPLD of claim 1, wherein each optical element is positioned to receive light from a plurality of light emitting regions.

5. The EPLD of claim 1 wherein the continuous emitter region is a heterojunction.

6. The EPLD of claim 1 wherein the continuous emitter region is a multiple quantum well layer.

7. The EPLD of claim 6, wherein the multiple quantum well is selected from gallium nitride and indium gallium nitride layers.

8. The EPLD of claim 1 wherein the p-layer electrode comprises a plurality of individually addressable electrodes.

9. The EPLD of claim 1 wherein the n-layer electrode comprises a plurality of individually addressable electrodes.

10. The EPLD of claim 1, wherein at least one of the optical elements is a collimating optical element.

11. The EPLD of claim 10, wherein the collimating optical element has a shape selected from spherical lens, hemisphere, cone, truncated cone, and Fresnel lens.

12. The EPLD of claim 1, wherein at least one of the optical elements is pyramidal.

13. The EPLD of claim 1 comprising a plurality of optical elements positioned to receive light from a plurality of light emitting regions.

14. The EPLD of claim 13, wherein the plurality of optical elements each have the same shape, size, or both.

15. The EPLD of claim 13, wherein each of the plurality of light emitting regions is separated by a light-blocking element.

* * * * *